United States Patent [19]

Gordon et al.

[11] 4,291,815
[45] Sep. 29, 1981

[54] CERAMIC LID ASSEMBLY FOR HERMETIC SEALING OF A SEMICONDUCTOR CHIP

[75] Inventors: Richard Gordon, Scarsdale; John G. Ciallella, White Plains, both of N.Y.

[73] Assignee: Consolidated Refining Co., Inc., Mamaroneck, N.Y.

[21] Appl. No.: 122,527

[22] Filed: Feb. 19, 1980

[51] Int. Cl.³ .................... B65D 7/28; B65D 6/40; B65D 39/00
[52] U.S. Cl. .................... 220/200; 29/588; 174/52 S; 174/68.5; 174/52 FP; 252/514; 219/87
[58] Field of Search ............. 220/200, 359; 174/52 S, 174/68.5, 52 FP; 156/330, 60, 306; 206/813, 328, 329; 29/588, 492; 219/87; 252/514

[56] References Cited

U.S. PATENT DOCUMENTS

| | | |
|---|---|---|
| 3,072,832 | 1/1963 | Kilby . |
| 3,340,602 | 9/1967 | Hontz . |
| 3,502,786 | 3/1970 | Stoll . |
| 3,538,597 | 11/1970 | Leinkram et al. . |
| 3,550,766 | 3/1969 | Nixen et al. . |
| 3,648,357 | 3/1972 | Green . |
| 3,683,146 | 8/1972 | Nugent et al. . |
| 3,768,157 | 10/1973 | Buie . |
| 3,809,797 | 5/1974 | McMunn et al. . |
| 3,823,468 | 7/1974 | Hascoe . |
| 3,874,549 | 4/1975 | Hascoe ......................... 220/200 |
| 3,896,542 | 7/1975 | Dale . |
| 4,109,818 | 8/1978 | Hascoe et al. ............... 220/200 |
| 4,192,433 | 3/1980 | Hascoe ......................... 220/200 |

*Primary Examiner*—George T. Hall
*Attorney, Agent, or Firm*—Amster, Rothstein & Engelberg

[57] ABSTRACT

A ceramic lid assembly includes an integral heat fusible layer defining a hermetic sealing area provided around the periphery of a ceramic lid for hermetic sealing semiconductor chips in a flat pack. The integral heat fusible layer includes a metallized layer, an oxidation inhibiting layer, and a flowed solderable layer in registration with each other in the hermetic sealing area.

10 Claims, 3 Drawing Figures

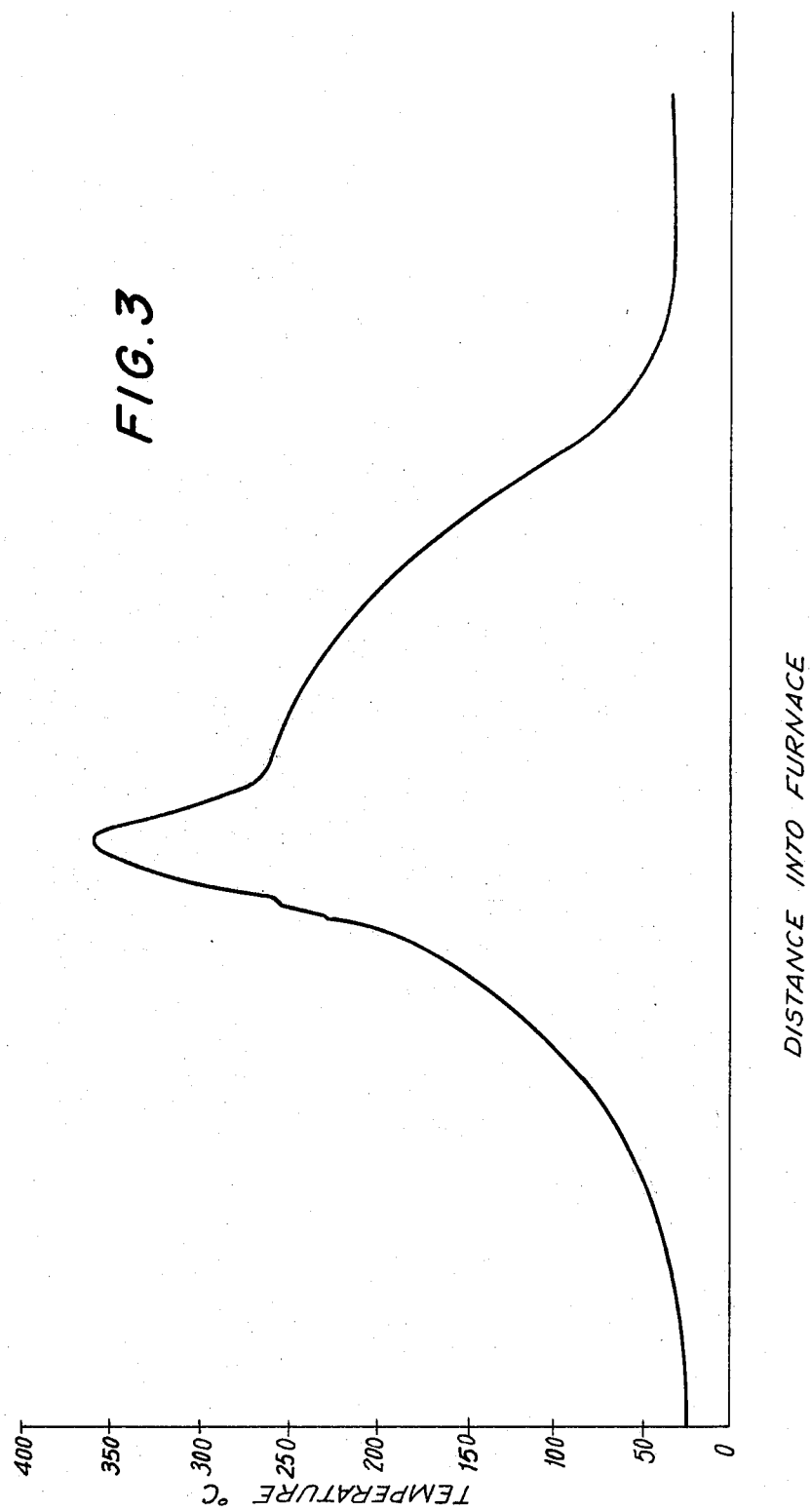

CERAMIC LID ASSEMBLY FOR HERMETIC SEALING OF A SEMICONDUCTOR CHIP

BACKGROUND OF THE INVENTION

This invention relates in general to hermetic sealing of semiconductor chips, and more particularly, to a ceramic lid assembly having a selectively deposited integral heat fusible layer for hermetic sealing of a package containing a semiconductor chip.

Integrated circuits in the form of one or more semiconductor chips are assembled for utilization in small packages generally known as flat packs. The flat pack encloses the semiconductor chip for protection of the various components therein to prevent damage from handling as well as atmospheric and other destructive conditions. The flat pack is formed of a package having a central opening on one major surface. The semiconductor chip is placed within a cavity of the flat pack defined by the central opening and is connected electrically by leads extending through the walls of the package. It has become conventional to provide a hermetically sealed cover over the central opening to protect the semiconductor chip.

Heretofore, it has been the practice to hermetically seal the semiconductor chip within the cavity of the flat pack by placing a preformed ring of heat fusible material, such as a gold-tin eutectic solder, on the sealing area of the package surrounding the cavity, and overlying the central opening with a gold placed Kovar lid. Upon heating the thus formed assembly, the gold-tin eutectic solder forms a hermetic seal between the package and the gold plated lid.

The solder materials of the preforms are generally brittle and their dimensions are so small that the preforms are very fragile and extremely difficult to handle during assembly. Because of the difficulty of handling such preforms, it has also been difficult to insure accurate registration between the preform, the peripheral region of the lid and the sealing area surrounding the cavity of the package. As a consequence, there has been a substantial yield loss in the assembled flat packs due to defects in the hermetic seal. In addition, with the price of gold increasing to unforeseen limits, there is a real economic need to minimize or completely eliminate the use of gold in providing a hermetically sealed flat pack.

One hermetic sealing technique which partially overcomes the above noted disadvantages is described in U.S. Pat. No. 3,874,549. In general, a gold plated Kovar lid for hermetic sealing of the package is superimposed with a heat fusible preform. The precise registration between the preform and the lid is achieved by spot welding the preform at a plurality of space locations about the peripheral area of the lid.

However, the welding of the preform to the lid greatly increases the risk of trapping dirt and dust therebetween which ultimately causes leaks in the hermetic seal. Visual inspection of the welded preform to the lid will not give any indication of the subsequent quality of the hermetic seal. Accordingly, defects in the hermetic seal are not noticed until the flat pack assembly is fully fabricated, resulting in an additional loss in yield. As these lids with welded preforms are comingled in automatic processing equipment, there is a tendency for the corners of the preforms to lift up and break off, further reducing the overall yield and quality of the hermetic seal.

With the semiconductor chip mounted in the cavity of the package, electrical connections must be made from the terminal pads on the semiconductor chip to the leads extending through the package walls. The most widely used method is thermo-compression bonding. Gold wire about one mil in diameter is used in a process called Ball Bonding. The gold wire, if not precisely aligned within the cavity of the flat pack, is in danger of making contact with the conductive gold plating on the Kovar lid. In the event of contact by the gold wires with the conductive gold plated lid, the semiconductor chip becomes shorted and inoperative. The use of a dielectric lid results in difficulty in obtaining a hermetic seal as it is known that the gold-tin eutectic solder used to fabricate the preforms will not wet and form a hermetic seal to dielectric materials such as ceramics.

Thus, there is heretofore an unsolved need to provide a dielectric lid for use in hermetically sealing semiconductor devices which overcomes the above-noted disadvantages resulting in the use of known lids and hermetic sealing techniques.

SUMMARY OF THE INVENTION

It is broadly an object of this invention to provide a lid assembly for hermetic sealing of a semiconductor chip which overcomes or avoids one or more of the foregoing disadvantages resulting from use of conventional lids. Specifically, it is within the contemplation of the present invention to provide a dielectric lid with an integral heat fusible layer disposed around the peripheral region of the lid in registration with a sealing area.

It is a further object of the present invention to provide a dielectric lid assembly for hermetic sealing of a semiconductor chip which eliminates or greatly reduces the utilization of gold as a material component.

It is still a further object of the present invention to provide a dielectric lid assembly having an integral heat fusible layer that eliminates the separate handling of fragile preforms used in hermetic sealing of semiconductor chips.

It is still a further object of the present invention to provide a dielectric lid assembly having an integral heat fusible layer applied by techniques that improve the registration of the heat fusible layer with the sealing area of the dielectric lid.

It is still a further object of the present invention to provide a dielectric lid assembly having an integral heat fusible layer which will maintain registration with the sealing area formed around the central opening of a flat pack during the hermetic sealing of a semiconductor chip.

It is still a further object of the present invention to provide a dielectric lid assembly having an integral heat fusible layer whose uniformity is an indication of the quality to be obtained in the hermetic seal.

It is still a further object of the present invention to provide a dielectric lid assembly of ceramic material which eliminates the possibility of electrical shorts between the gold ball bonded wires.

In accordance with the present invention there is provided a lid assembly for hermetic sealing of a package containing a semiconductor chip including a lid of dielectric material and an integral heat fusible layer deposited on the lid in a peripheral region defining a hermetic sealing area.

BRIEF DESCRIPTION OF THE DRAWINGS

The above brief description, as well as further objects, features and advantages of the present invention will be more fully understood by reference to the following detailed description of a presently preferred, nonetheless illustrative, ceramic lid assembly in accordance with the present invention when taken in conjunction with the accompanying drawings wherein:

FIG. 3 is a melting profile for a gold-tin alloy preform in a three-zone furnace.

DETAILED DESCRIPTION OF THE PREFERRED EMBODIMENTS

Figure 1:
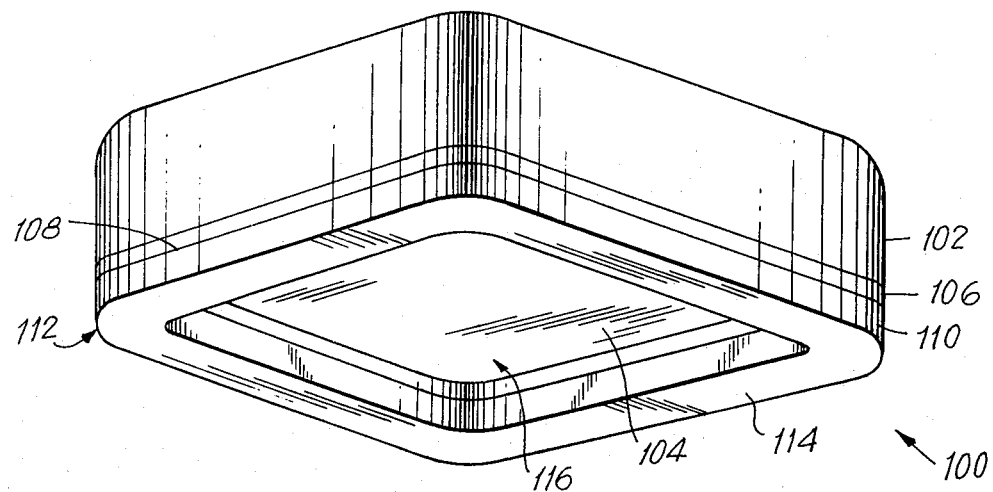
FIG. 1 is a prospective view of a ceramic lid assembly having an integral heat fusible layer for hermetic sealing of a semiconductor chip within a flat pack.

Referring specifically to the drawings, there is shown generally in FIG. 1 a lid assembly 100 including lid 102. The lid 102 has at least one planar surface 104. Aligned around the periphery of the surface 104 is a metallized heat fusible layer 106. The metallized layer 106 is provided in the form of a ring. The term "ring" is used herein in its generic sense to include a closed loop of any configuration corresponding to the peripheral area of the lid 102, usually round or rectangular. Optionally, over the metallized layer 106 and in registration therewith is an oxidation inhibiting layer 108. Deposited over the oxidation inhibiting layer 108 is a solderable heat fusible layer 110 in registration with the metallized layer 106. The metallized and solderable layers 106, 110 and optional oxidation inhibiting layer 108 provide an integral heat fusible layer 112 around the periphery of lid 102 to define a hermetic sealing area 114 in the form of a ring having a central opening 116.

The lid 102 is of substantially non-conductive or dielectric material having a thickness range of from 0.010–0.040 inch. Ceramic material is generally preferred as it is inexpensive, easily metallized and has a cofficient of thermal expansion which matches that of the semiconductor flat pack. Ceramic material found suitable includes the oxides of aluminum, beryllium and magnesium. For example, polycrystalline aluminum oxide commercially available from Coors Porcelin Co., Colorado, designation ADS-96F and 3M Technical Ceramic Product Div., Tennessee, designation Alsimag 614 are excellent ceramic material. Single crystal sapphire is ideally suited for use as a lid in hermetic sealing of EPROMs by being transparent to ultra-violet light. The use of single crystal sapphire provides a large window opening for easy accessibility to the semiconductor chip for erasing and programming the Read Only Memory.

In general, lids made of ceramic material will not be wetted by most commercially available alloys used for the solderable heat fusible layer 110. Failure of the solderable layer 110 to adhere to the ceramic lid 102 will prevent the formation of quality hermetic seals. The solderable layer 110 is assured adherence to the ceramic lid 102 by depositing an adherent wetable metal layer around the periphery of the ceramic lid 102 such as metallized layer 106.

There are commercially available screen printable compositions in the form of metallized pastes which will effectively metallize the surface 104 of ceramic lid 102. These metallized pastes are mixtures of metal powders suspended in organic additives to impart fluid properties to the paste in providing for screen printing application. Known organic additives include methyl, ethyl, butyl and propyl alcohol. The metallized pastes can also include a permanent binder of low melting point glass frit which bonds the resulting metallized layer to the substrate. These glass frits include bismuth oxide, cadmium oxide and lead borosilicate. The metallized pastes are screen printed to a substrate and subsequently baked at a low temperature, such as 125° C. to burn out the volatile organic additives. The dried metallized paste is fired at an elevated temperature, such as 750°–1050° C. to fuse the metal powders and bond the resulting metallized layer to the substrate. A preferred composition for metallized layer 106 is a mixture of molybdenum/manganese, 80%/20% by weight respectively, commercially available in a screen printable paste from Electro-Ceramic, New Jersey, for firing between 1300°–1600° F. In addition, palladium, silver and gold screen printable pastes that include a glass frit binder are commercially available from Alpha Metals, New Jersey and E. I. duPont, Delaware, for firing between 1400°–1850° F. can also be used.

The hermetic sealing of the flat pack is provided by solderable layer 110 which can be in the form of a screen printable metallized paste as previously described, or as a stamped preform of a soft solder alloy. Stamped preforms are commercially available from Consolidated Refining Company, New York, in a wide range of alloys having melting points generally below 450° centigrade. The stamped preforms are fabricated from alloys of lead, tin, bismuth, gold, silver, antimony and zinc. The preferred composition of solderable layer 110 is an alloy of lead/tin/silver, 88%/10%/2% by weight, respectively, and gold/tin, 80%20% by weight, respectively. Selected compositions of the stamped preforms in the form of a screen printable metallized paste are commercially available from Alpha Metals and E. I. duPont.

The adhesion of the solderable layer 110 to the metallized layer 106 can be improved by the inclusion of an oxidation inhibiting layer 108. The oxidation inhibiting layer 108 enhances the solderability of the metallized layer 106 by the solderable layer 110 by prevently surface oxidation of metallized layer 106 which could occur during the construction of the lid assembly 100. The oxidation inhibiting layer 108 is a thin layer of from 50–100 micro inches of nickel, gold or copper which may be deposited by electroplating. In the preferred embodiment, nickel has been found to be of the greatest effectiveness in inhibiting oxide formation at a low material cost.

In one embodiment, an aluminum oxide polycrystalline ceramic lid 102, designation ADS-96F or Alsimag 614, is provided. A one mil thick layer of molybdenum/manganese paste is silk screened around the peripheral area of a cleaned surface 104 of lid 102. The silk screening operation is carried out according to well known techniques such as those taught in "Thick Film Hybrid Microcircuit Technology", Donald W. Hamer and James V. Biggers, Wiley-Interscience, a Division of John Wiley & Sons, Inc., New York, Copyright 1972; and "Thick Films Technology and Chip Joining", Lewis F. Miller, Gordon and Breach Science Publishers, Inc., New York, Copyright 1972.

The molybdenum/manganese layer is in the shape of a ring having a width of approximately 0.1 inches and provides the metallized layer 106. The metallized layer 106 is first dried at low temperature to remove the volatile organic additives and then fired in an inert or reducing atmosphere at 1400° centigrade to fuse the molybdenum/manganese paste into the metallized layer 106. Inert atmospheres of argon, nitrogen and helium, and reducing atmosphere of wet hydrogen/nitrogen, 35%/65% by volume, respectively, are useful to prevent the oxidation of the surface of the metallized molydenum/manganese layer.

To enhance the solderability of the metallized molybdenum/manganese layer and to prevent subsequent surface oxidation, a 50–100 micro inch layer of nickel is electroplated onto the surface of the metallized molybdenum/manganese layer.

A stamped preform about 2 mils thick in a ring shape of a solderable alloy of gold/tin, 80%/20% by weight, respectively, having a melting point of about 280° centigrade is placed within the cavity of a carbon boat constructed to receive the stamped preform and ceramic lid 102. The stamped preform provides the solderable layer 110. The ceramic lid 102 is placed within the carbon boat with the metallized molybdenum/manganese layer facing downward so as to be in registration with the stamped preform. A forging weight is placed on top of ceramic lid 102 to enhance the wetting of the stamped preform to the nickel plated metallized molybdenum/manganese layer as the stamp preform begins to melt during a flowing operation.

The carbon boat is transported through a multi-zoned furnace at a speed of 10 inches per minute. The furnace is constructed of three zones having independent temperature control. The first zone is set at 250° centigrade, the second zone at 240° centigrade, and the third zone at 505° centigrade. Optionally, a fourth zone may be used as a cooling chamber to cool the ceramic lid assembly 100 before exiting from the furnace. The actual temperature attained by the ceramic lid assembly 100 passing through the furnace is shown in the melting profile of FIG. 3. A disassociated ammonia atmosphere at a flow rate of approximately 20 SCFH is introduced into the furnace as a reducing atmosphere to prevent the formation of oxides.

The stamp preform flows onto the nickel and metallized molybdenum/manganese layer to form an integral heat fusible layer 112 in the hermetic sealing area 114 of the ceramic lid 102.

In another embodiment, the stamped preform is a solderable alloy of lead/tin/silver, 88%/10%/2% by weight, respectively, having a melting point of about 268°–299° centigrade. The ceramic lid assembly 100 is placed within a carbon boat and passed through the multi-zone furnace at about 5 inches/minute belt speed to melt the preform and produce the integral heat fusible layer 112. The first zone is set at about 380° centigrade, the second zone at about 400° centrigrade, and the third zone at about 200° centigrade.

In another embodiment, the solderable layer 110 is provided as a 2 mil thick screen printable metallized paste of 88% lead, 10% tin and 2% silver. The solderable layer 110 is screen printed over the nickel oxidation inhibiting layer 108 in registration with the metallized layer 106 of metallized molybdenum/manganese. The ceramic lid assembly 100 is placed in the carbon boat to fire and flow at about 800° centigrade the solderable metallized paste to the nickel and metallized molybdenum/manganese layer.

As thus described, the ceramic lid assembly 100 is provided with a metallized layer 106 protected from oxidation by an oxidation inhibiting layer 108 including a solderable layer 110 in registration with each other around the periphery of surface 104 of the ceramic lid 102. Upon firing of the ceramic lid assembly 100 a flowed integral heat fusible layer 112 provides a hermetic sealing area 114. The ceramic lid assembly 100 eliminates the handling of fragile stamped preforms, provides for accurate registration of the integral heat fusible layer 112 with the ceramic lid 102 and the flat pack, eliminates the use of expensive gold as a material component, and provides for the visual inspection of the integral heat fusible layer to determine the quality of the subsequent hermetic seal.

Hermetically sealed flat packs according to the present invention have been found to surpass leak testing according to the procedures of Mil Spec. 883B. The hermetically sealed flat packs are placed in a helium atmosphere at 35–50 p.s.i. for two hours at room temperature. Using a helium leak detector, leak rates of less than $1 \times 10^{-8}$ were observed. Additional leak testing by placing the flat pack in cold freon, temperature cycling from −65° centigrade to +150° centigrade, placing the flat packs in a 24 hour bake at 150° centigrade, and storage testing for 168 hours all resulted in acceptable leak rates for flat packs hermetically sealed using ceramic lid assemblies according to the present invention.

Figure 2:
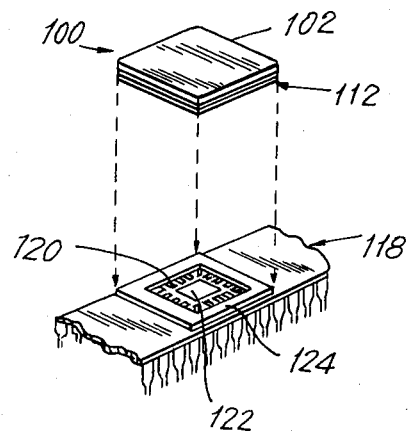
FIG. 2 is a prospective view of a ceramic lid assembly in registration with a semiconductive chip for hermetic sealing.

In FIG. 2, the method of hermetic sealing of the ceramic lid assembly 100, fabricated according to the present invention, to the flat pack 118 having a cavity 120 in which is disposed a semiconductor chip 122, is shown. A flat pack 118 may be either of ceramic or metallic material; if ceramic, a conductive ring 124 is fused to the flat pack surrounding the cavity 120. The flat pack 118 and the ceramic lid assembly 100 in registration therewith, is passed through a suitable belt furnace for fusing the integral heat fusible layer 112 with ring 124 to hermetically seal the semiconductor chip 122 in the cavity 120.

Accordingly, by using the method and ceramic lid assembly according to the present invention for hermetic sealing of a semiconductor chip, the handling of fragile stamped preforms is avoided. Further, the method insures that the integral heat fusible layer 112 remains in registration with the peripheral area of the ceramic lid 102 and with the conductive ring 124 during the sealing operation.

Although the invention herein has been described with reference to particular embodiments, it is to be understood that these embodiments are merely illustrative of the principles in application of the invention. Thus, it is to be understood that numerous modifications may be made in the illustrated embodiments and other arrangements may be devised without departing from the spirit and scope of the invention. For example, the flowing operation of the present invention may be used to flow a stamped preform or metallized paste to the peripheral area of a gold plated Kovar lid to provide an integral heat fusible layer defining a hermetic sealing area.

What is claimed is:

1. A lid assembly for hermetic sealing of a package containing a semiconductor chip comprising: a lid of dielectric material including an integral heat fusible metallic layer deposited on said lid in a peripheral region defining a hermetic sealing area.

2. The lid assembly as set forth in claim 1 wherein said integral heat fusible layer includes a metallized heat fusible layer and a solderable heat fusible layer in registration therewith.

3. The lid assembly as set forth in claim 2 wherein said metallized layer and said solderable layer are provided as a fired printed heat fusible layer.

4. The lid assembly as set forth in claim 2 wherein said metallized layer includes a fired printed heat fusible layer and said solderable layer includes a preform of a solderable alloy flowed thereto.

5. The lid assembly as set forth in claim 2 further including an oxidation inhibiting layer disposed between said metallized layer and said solderable layer.

6. A dielectric lid assembly for hermetic sealing of a package containing a semiconnector chip comprising a ceramic lid, a printed metallized heat fusible layer deposited on said ceramic lid in a peripheral region defining a hermetic sealing area, and a solderable heat fusible layer disposed on said metallized layer in registration therewith.

7. The lid assembly as set forth in claim 6 further including an oxidation inhibiting layer disposed between said metallized layer and said solderable layer.

8. The lid assembly as set forth in claim 6 wherein said solderable layer includes a fired printed heat fusible layer or a heat fusible preform of solder alloy composition.

9. The lid assembly as set forth in claim 6 wherein said solderable layer is a composition of lead, tin and silver.

10. The lid assembly as set forth in claim 6 wherein said metallized layer includes a composition of molybdenum and manganese.

* * * * *

REEXAMINATION CERTIFICATE (3635th)
United States Patent [19]
Gordon et al.

[11] B1 4,291,815
[45] Certificate Issued Sep. 29, 1998

[54] CERAMIC LID ASSEMBLY FOR HERMETIC SEALING OF A SEMICONDUCTOR CHIP

[75] Inventors: Richard Gordon, Scarsdale; John G. Ciallella, White Plains, both of N.Y.

[73] Assignee: Semiconductor Packaging Materials Co., Inc.

Reexamination Requests:
No. 90/004,713, Aug. 1, 1997
No. 90/004,778, Oct. 1, 1997

Reexamination Certificate for:
Patent No.: 4,291,815
Issued: Sep. 29, 1981
Appl. No.: 122,527
Filed: Feb. 19, 1980

[51] Int. Cl.$^6$ .................. H01L 23/10; B65D 6/40; B65D 39/00
[52] U.S. Cl. .................. 220/200; 174/52.3; 174/52.4; 219/87; 228/121; 228/124.6; 252/514; 438/126
[58] Field of Search .................. 220/200; 174/52.3, 174/52.4; 219/87; 228/121, 124.6; 252/514; 438/126

[56] References Cited

U.S. PATENT DOCUMENTS

| | | | |
|---|---|---|---|
| Re. 30,348 | 7/1980 | Hascoe | 228/56 |
| 3,187,083 | 6/1965 | Grimes . | |
| 3,495,023 | 2/1970 | Hessinger et al. | 174/52 |
| 3,544,857 | 12/1970 | Byrne et al. | 317/324 |
| 3,626,259 | 12/1971 | Garboushian et al. | 317/234 R |
| 3,665,592 | 5/1972 | Aposporos | 29/588 |
| 3,684,533 | 8/1972 | Conwicke | 106/1 |
| 3,916,434 | 10/1975 | Garboushian | 357/74 |
| 3,946,190 | 3/1976 | Hascoe | 219/91 |
| 4,020,987 | 5/1977 | Hascoe | 228/56 |
| 4,105,861 | 8/1978 | Hascoe | 174/52 |
| 4,190,176 | 2/1980 | Hascoe | 220/359 |
| 4,232,814 | 11/1980 | Hascoe | 228/173 |
| 4,243,729 | 1/1981 | Hascoe | 428/577 |
| 4,284,481 | 8/1981 | Hascoe | 204/27 |

FOREIGN PATENT DOCUMENTS

| | | |
|---|---|---|
| 38-3012 | 4/1963 | Japan . |
| 47-6487 | 2/1972 | Japan . |
| 48-31511 | 9/1973 | Japan . |
| 48-34072 | 10/1973 | Japan . |
| 49-45729 | 12/1974 | Japan . |
| 53-39870 | 6/1975 | Japan . |
| 50-155454 | 12/1975 | Japan . |

OTHER PUBLICATIONS

J.R. Sims et al., "An Approach To A Low Cost, Custom, Hermetic Hybrid Package," Proceedings of the 1979 International Microelectronics Symposium, pp. 201–206, Nov. 1979.

"We'd like to be more than just someone's secret source of supply," Circuits Manufacturing, p. 78, Aug. 1975.

A.J. Arnold et al., "Cap With Metallization Designed For Reflow Solder Attachment To A Substrate Seal Band," IBM Technical Disclosure Bulletin, vol. 22, No. 6, p. 2278, Nov. 1979.

Alan W. Postlethwaite, Hermetic and Non–Hermetic Packaging, Solid State Technology, pp. 67–75, Aug. 1970.

Frank J. Bachner, et al., "Rigid and Non–Rigid Beam–Lead Substrates," Solid State Technology, pp. 62–66, Aug. 1970.

Frank H. Bower, "Hermetic Sealing of Integrated Circuit Packages," Solid State Technology, pp. 56–61, Aug. 1970.

Henry Hirsch, "Resin Systems for Encapsulation of Microelectronics Packages," Solid State Technology, pp. 48–55, Aug. 1970.

(List continued on next page.)

*Primary Examiner*—Stephen Garbe

[57] ABSTRACT

A ceramic lid assembly includes an integral heat fusible layer defining a hermetic sealing area provided around the periphery of a ceramic lid for hermetic sealing semiconductor chips in a flat pack. The integral heat fusible layer includes a metallized layer, an oxidation inhibiting layer, and a flowed solderable layer in registration with each other in the hermetic sealing area.

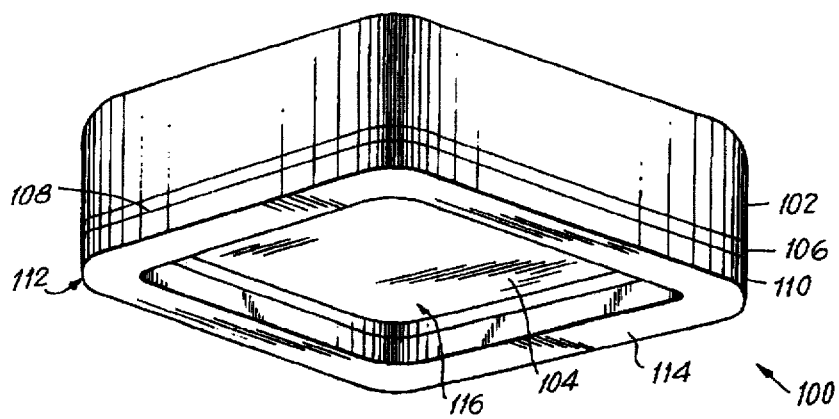

OTHER PUBLICATIONS

Gerald K. Fehr, "Microcircuit Packaging and Assembly-State of the Art," Solid State Technology, pp. 41–47, Aug. 1970.

"Flatpack Solder–Sealing Yields of 98+%," Solid State Technology, p. 5, Aug. 1970.

We'd like to be more than just someones secret source of supply, Circuits Manufacturing, p. 4, Feb. 1975.

Hughes Electron Dynamics Division ad, Circuits Manufacturing, Mar. 1975.

Ceramic Hybrid DIPs For Op–Amps, A/D Converters, Circuits Manufacturing, p. 22, Apr. 1975.

Alumina Substrates Snap Apart, Circuits Manufacturing, p. 54, Jul. 1970.

Fully Automatic Flat Pack Lead Preparation equipment, Circuits Manufacturing, p. 50, Oct. 1970.

Method Applies Glaze to Ceramics, Circuits Manufacturing, Jan. 1969.

Advertisement by Zirmex, Inc. relating to lid.

Thick Film Materials For Electro–Optical Applications, S. Stein, pp. 148–157 in Proceedings of 22d Electronic Components Conference, Washington, D.C., May 15–17, 1972 ("Stein").

Automation Speeds Cerdip Fabrication, *Circuits Manufacturing*, Dec. 1970, p. 42 ("Circuits Manufacturing").

A Hybrid Microelectronic System Package, R.D. Gumm, Proceedings of the Technical Program, National Electronic Packaging And Production Conference, 1976 ("Gumm").

Advertisement For DuPont Solder And Braze Compositions, Circuits Manufactuing, Oct. 1970 ("DuPont Advertisement").

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–10 are cancelled.

* * * * *